US007911068B2

(12) United States Patent
Meyer et al.

(10) Patent No.: US 7,911,068 B2
(45) Date of Patent: Mar. 22, 2011

(54) COMPONENT AND METHOD FOR PRODUCING A COMPONENT

(75) Inventors: Thorsten Meyer, Regensburg (DE); Harry Hedler, Germering (DE); Markus Brunnbauer, Lappersdorf (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 11/486,443

(22) Filed: Jul. 13, 2006

(65) Prior Publication Data
US 2008/0012152 A1 Jan. 17, 2008

(30) Foreign Application Priority Data

Jul. 11, 2006 (DE) .......................... 10 2006 032 073

(51) Int. Cl.
*H01L 23/48* (2006.01)
(52) U.S. Cl. ........ 257/786; 257/737; 257/738; 257/778; 257/734; 257/784; 257/276; 257/457; 257/459; 257/584; 257/690; 257/81; 257/91; 257/99; 257/E23.069; 257/E23.07; 257/E23.051; 257/E23.101; 257/E21.503; 257/E33.075; 257/E31.131
(58) Field of Classification Search .................. 257/202, 257/203, 207, 208, 691, 690
See application file for complete search history.

(56) References Cited

U.S. PATENT DOCUMENTS

| 6,114,005 | A | 9/2000 | Nagai | |
|---|---|---|---|---|
| 6,399,178 | B1 * | 6/2002 | Chung | 428/131 |
| 6,825,108 | B2 | 11/2004 | Khan et al. | |
| 6,919,631 | B1 * | 7/2005 | Hoffman et al. | 257/707 |
| 6,965,165 | B2 * | 11/2005 | Lin | 257/758 |
| 6,975,030 | B1 * | 12/2005 | Akram et al. | 257/737 |
| 7,067,928 | B2 * | 6/2006 | Yamaha | 257/781 |
| 2001/0002066 | A1 * | 5/2001 | Mita et al. | 257/693 |
| 2001/0006251 | A1 * | 7/2001 | Miyaki et al. | 257/668 |
| 2001/0011526 | A1 * | 8/2001 | Doering et al. | 118/729 |
| 2001/0020636 | A1 * | 9/2001 | Koskenmaki et al. | 228/180.22 |
| 2001/0027922 | A1 | 10/2001 | Chen | |
| 2001/0040282 | A1 * | 11/2001 | Corisis et al. | 257/686 |
| 2002/0047215 | A1 * | 4/2002 | Akiyama et al. | 257/778 |
| 2002/0057558 | A1 * | 5/2002 | Barrow | 361/760 |
| 2002/0105092 | A1 * | 8/2002 | Coyle | 257/778 |
| 2003/0192181 | A1 * | 10/2003 | Fjelstad et al. | 29/847 |
| 2004/0212061 | A1 * | 10/2004 | Ochi et al. | 257/678 |
| 2005/0067721 | A1 * | 3/2005 | Blaszczak et al. | 257/787 |
| 2005/0087858 | A1 * | 4/2005 | Singh et al. | 257/698 |

(Continued)

FOREIGN PATENT DOCUMENTS

DE 198 21 395 C2 5/1998

(Continued)

OTHER PUBLICATIONS

German Office Action dated Feb. 8, 2007(and English Translation).

(Continued)

*Primary Examiner* — Minh-Loan T Tran
*Assistant Examiner* — Fei Fei Yeung Lopez
(74) *Attorney, Agent, or Firm* — Brinks Hofer Gilson & Lione

(57) ABSTRACT

A component and a method for producing a component are disclosed. The component comprises an integrated circuit, a housing body, a wiring device overlapping the integrated circuit and the housing body, and one or more external contact devices in communication with the wiring device.

14 Claims, 5 Drawing Sheets

U.S. PATENT DOCUMENTS

| | | | |
|---|---|---|---|
| 2005/0110162 A1* | 5/2005 | Meyer-Berg et al. | 257/778 |
| 2005/0224560 A1* | 10/2005 | Takesue | 228/180.22 |
| 2005/0224967 A1* | 10/2005 | Brandenburg et al. | 257/737 |
| 2005/0232728 A1* | 10/2005 | Rice et al. | 414/217 |
| 2006/0091524 A1* | 5/2006 | Karashima et al. | 257/700 |
| 2006/0091561 A1 | 5/2006 | Dangelmaier | |
| 2007/0238220 A1* | 10/2007 | Lii et al. | 438/106 |

FOREIGN PATENT DOCUMENTS

| | | |
|---|---|---|
| DE | 198 21 395 C2 | 6/2000 |
| DE | 103 24 615 A1 | 9/2004 |
| EP | 0 835 600 B1 | 3/1997 |
| EP | 0 835 600 B1 | 1/2005 |

OTHER PUBLICATIONS

German Office Action for related German patent application, mailed Nov. 3, 2009. English translation included.

* cited by examiner

FIG 4

(WLP-Fan-Out)

| | S1 | S2 | S3 | S4 | S5 | S6 | S7 | S8 | S9 | S10 | S11 | S12 | S13 | S14 | S15 | S16 | S17 | S18 |
|---|---|---|---|---|---|---|---|---|---|---|---|---|---|---|---|---|---|---|
| A | 1307 | 1525 | 1859 | 2284 | 2711 | 3075 | 3373 | 3624 | 3836 | 4019 | 4179 | 4308 | 4402 | 4463 | 4498 | 4513 | 4489 | 4530 |
| B | | 2023 | 2844 | 3961 | 4998 | 5666 | 6136 | 6539 | 6910 | 7252 | 7557 | 7814 | 8017 | 8165 | 8265 | 8324 | 8356 | 8372 |
| C | | | 4519 | 5921 | 6530 | 6897 | 7252 | 7636 | 8041 | 8450 | 8843 | 9200 | 9507 | 9753 | 9934 | 10056 | 10121 | 10140 |
| D | | | | 6683 | 7029 | 7357 | 7756 | 8232 | 8769 | 9360 | 9990 | 10626 | 11219 | 11719 | 12095 | 12345 | 12482 | 12524 |
| E | | | | | 7369 | 7797 | 8382 | 9170 | 10292 | 12085 | 14806 | 17665 | 19699 | 20876 | 21499 | 21813 | 21955 | 21992 |
| F | | | | | | 8460 | 9572 | 12034 | 17955 | 22419 | 20653 | 17700 | 15799 | 14807 | 14328 | 14118 | 14040 | 14022 |
| G | | | | | | | 13204 | 22443 | 19685 | 13437 | 11174 | 10295 | 9894 | 9668 | 9523 | 9432 | 9383 | 9367 |
| H | | | | | | | | 17490 | 11344 | 9238 | 8299 | 8069 | 8123 | 8194 | 8233 | 8254 | 8265 | 8269 |
| I | | | | | | | | | 8426 | 6208 | 4961 | 4880 | 5315 | 5848 | 6298 | 6608 | 6785 | 6843 |
| K | | | | | | | | | | 3143 | 2021 | 2004 | 2184 | 2428 | 2680 | 2897 | 3043 | 3095 |
| L | | | | | | | | | | | 832 | 876 | 943 | 1007 | 1060 | 1098 | 1121 | 1128 |
| M | | | | | | | | | | | | 1142 | 1323 | 1480 | 1610 | 1707 | 1766 | 1785 |
| N | | | | | | | | | | | | | 1640 | 1940 | 2193 | 2378 | 2486 | 2522 |
| P | | | | | | | | | | | | | | 2436 | 2882 | 3177 | 3326 | 3371 |
| R | | | | | | | | | | | | | | | 3437 | 3702 | 3807 | 3837 |
| S | | | | | | | | | | | | | | | | 3905 | 3996 | 4027 |
| T | | | | | | | | | | | | | | | | | 4115 | 4178 |
| U | | | | | | | | | | | | | | | | | | 4342 |

COMPONENT AND METHOD FOR PRODUCING A COMPONENT

RELATED APPLICATIONS

The present application claims priority to German Application No DE 10 2006 032 073.5, filed Jul. 11, 2006, the entirety of which is hereby incorporated herein by reference.

BACKGROUND

Components may contain integrated circuits having a plurality of mutually different circuit parts or having a multiplicity of semiconductor components connected in parallel, e.g. transistors. Such integrated components are used e.g. in motor vehicle electronic circuits, mobile radio devices, cameras, etc. In order to connect the integrated component to a printed circuit board, contact devices are required.

There is a need for a simply constructed component or for a simply constructed housing arrangement which, in particular, has a high reliability and/or bears a multiplicity of contact devices and is thus comparatively large. Moreover, there is a need for a method for producing such housing arrangements.

SUMMARY OF THE DISCLOSURE

The disclosure describes a component which comprises or contains an integrated circuit, a housing body, a wiring device overlapping the circuit and the housing body, and a multiplicity of contact devices at the wiring device. The wiring device overlapping the housing body makes it possible to arrange a large number of external contacts at the component.

Moreover, a method is specified which comprises the following steps:
- provision of an auxiliary carrier,
- arrangement of a multiplicity of mutually separate circuits on the auxiliary carrier,
- after the arrangement, application of a housing body material into interspaces between the circuits, and
- after the application of the housing body material, production of a wiring arrangement at the circuits and at the housing body material.

BRIEF DESCRIPTION OF THE FIGURES

Exemplary embodiments of the invention are explained in more detail below with reference to the accompanying drawings, in which:

FIG. 4 shows a table containing simulation results for the reliability of contact devices of one embodiment of the housing arrangement.

DETAILED DESCRIPTION OF THE DISCLOSURE

Figure 1:
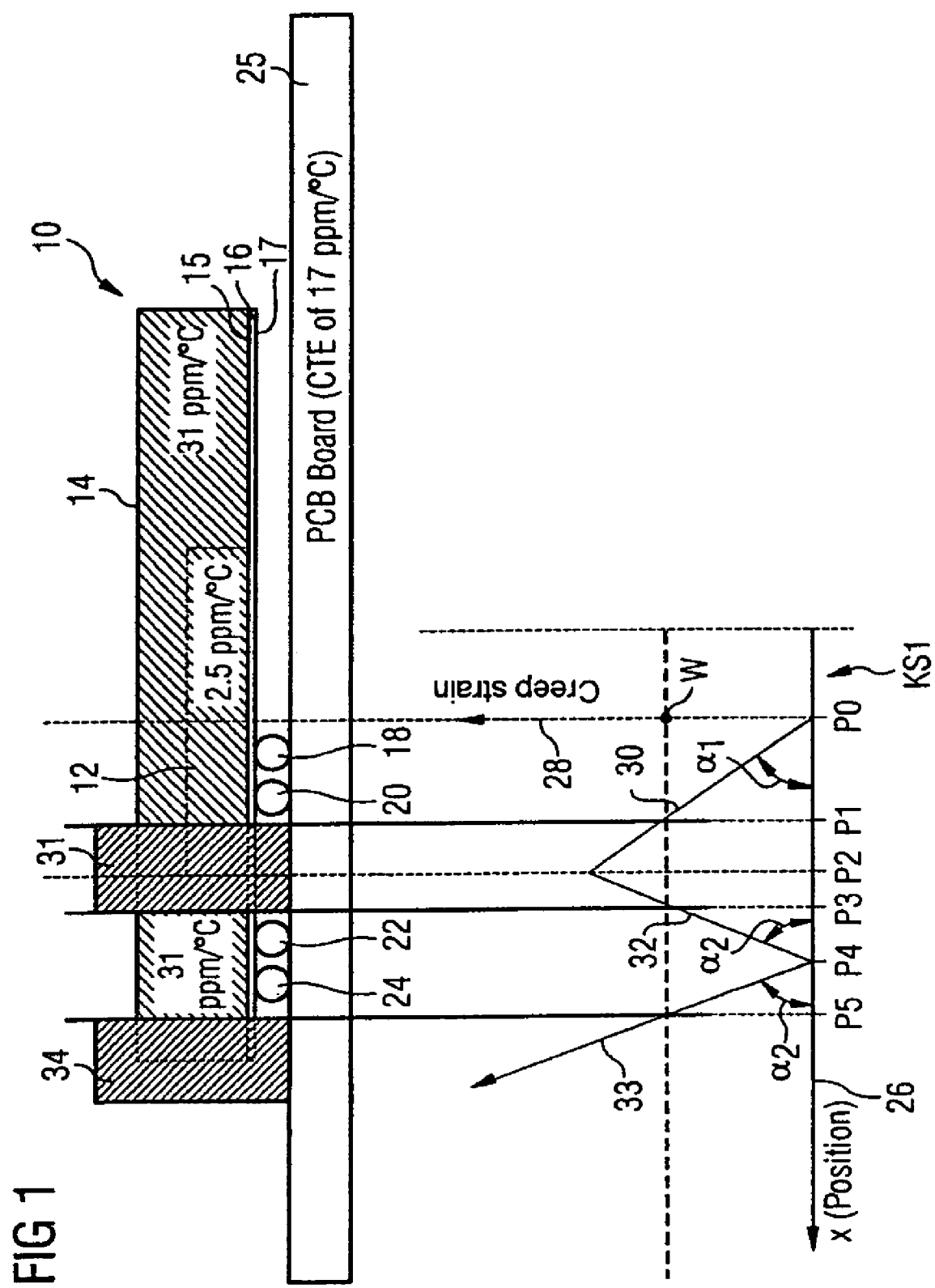
FIG. 1 shows a sectional view of one embodiment of a BGA housing arrangement soldered onto a printed circuit board.

One or more of the disclosed embodiments relate to a component or a housing arrangement of an integrated circuit or chip. The housing arrangement contains an integrated circuit and a housing body, which are e.g. both arranged in one plane. Moreover, the housing arrangement contains a wiring device extending e.g. parallel to the plane and having a multiplicity of conductive structures. A multiplicity of contact devices are arranged at the wiring device.

The housing arrangement may be, in particular, a so-called Ball Grid Array (BGA). The integrated circuit or chip may contain a multiplicity of electronic semiconductor components, such as transistors, e.g. bipolar transistors or CMOS transistors (Complementary Metal Oxide Transistor), or memory transistors. The circuit substrate used may be e.g. an SOI substrate (Silicon On Insulator), a ceramic substrate, a semiconductor substrate, in particular a silicon substrate, or a compound semiconductor substrate.

The housing body used may be plastic, for example, with which the circuit is encapsulated, for example. However, it is also possible, for example, to connect a frame made of solid material to the circuit, e.g. by adhesive bonding or a press fit. The housing body is usually an electrically insulating material, e.g. a polymer. It may serve to protect the circuit from ambient influences, in particular from moisture and mechanical stress. The CTE (Coefficient of Thermal Expansion) or coefficient of thermal linear expansion is chosen for example such that it matches the CTE of a carrier plate onto which the component is mounted.

The conductive structures of the wiring arrangement may be e.g. interconnects and plated-through holes. The conductive structures may form electrically conductive connections from an area of the wiring device which faces the circuit to a contact area of the wiring device which is remote from said area. The wiring arrangement may serve to produce an electrically conductive connection between the contacts of the integrated circuit which are arranged close together and the contact devices of the component which are arranged with a larger area. The wiring arrangement may be applied in layers, e.g. monolayer metallization layer, multilayer metallization, with electrically insulating layers in between, in particular made of polymer material.

The contact devices may be arranged at the contact area and are so-called solder balls, by way of example. However, contact devices used also include, by way of example, optionally coated copper projections which are then adhesively bonded e.g. to a carrier printed circuit board using a conductive adhesive. The contact devices may serve to produce electrically conductive contacts between the wiring arrangement and a carrier plate.

The abovementioned overlap lies e.g. as viewed in a direction which lies in the direction of the normal to a plane in which the width of the wiring arrangement extends.

Limitations in reliability often occur e.g. on account of the low temperature cycling reliability of large packages at the so-called second level, that is to say when connecting the housing arrangement to the carrier plate, which may carry a plurality of housing arrangements or a multiplicity of other electronic components, e.g. individual components such as resistors, capacitors or coils. The low reliability is caused in particular on account of mismatches in the coefficients of thermal expansion between chip and board or carrier plate. These mismatches are thus intended to be reduced. The thermomechanical loads are particularly large in the case of power components, that is to say in the case of components having switching currents of greater than 0.5 ampere or greater than 1 ampere, e.g. DMOS circuits having more than 100 000 transistors connected in parallel, as are used in particular in vehicular technology.

In one embodiment, the contact devices are arranged in at least one series, at least once the distance between adjacent contact elements in the series being more than 1.5 times as great as the rest of the distances in said series. By virtue of distances selectively chosen to be larger in component regions having particularly high mechanical stress on account of mismatched coefficients of thermal expansion, it is possible to reduce mechanical stresses between component and carrier plate. It is thus possible to prevent contact elements from tearing away from the component or from the carrier board due to temperature fluctuations, even when the component dimensions are very large. The series mentioned extends e.g. along a straight line or along an arc.

In particular, outer contact devices lie closer to the edge of the housing arrangement than inner contact devices. The outer contact devices may be arranged e.g. in accordance with a matrix in a multiplicity of columns and a multiplicity of rows. Moreover, there may be an intermediate zone, which is free of contact devices and in which no contact devices are arranged at all crossover points between a row and a column of the matrix. The intermediate zone lies between the outer contact devices and the inner contact devices. The inner contact devices may be arranged e.g. likewise in accordance with the matrix or in a different way, e.g. in accordance with a different matrix, in particular with a different grid pitch. The use of a matrix enables simple matching of positions of the contact devices at the housing arrangement with corresponding positions at a carrier plate, e.g. with the position of soldering lands on a carrier printed circuit board.

The intermediate zone advantageously overlaps the filling material and the circuit. The overlap is e.g. in each case greater than 250 micrometers or even greater than 500 micrometers, that is to say that, by way of example, both the housing body overlap is greater than 250 micrometers and the circuit overlap is greater than 250 micrometers. The overlap ensures that the abrupt material transition between circuit and housing body does not affect, or affects only to an acceptable extent, the thermomechanical reliability of the housing arrangement mounted onto the carrier printed circuit board. In this case, the overlap occurs as viewed in the direction of the normal to that area of the circuit or of the housing body which faces the contact devices.

The intermediate region may be or is preferably free of further contact devices, in particular contact devices without which the circuit does not function. As an alternative, however, redundant contact devices are arranged in the intermediate region, that is to say contact devices whose failure does not impair, or impairs only to an acceptable extent, the function of the circuit.

The component may have a dimension of greater than 9 millimeters in the case of contact devices having a diameter of 450 micrometers to 550 micrometers, a grid pitch between the contact devices preferably lying within the range of 750 micrometers to 850 micrometers.

The diameter is the sphere diameter in the case of spherical contact devices, the cylinder diameter in the case of cylindrical contact devices and, in the case of other shapes, e.g. barrel shape or parallelepipedal shape, the diameter or the lateral extent of the contact device in a plane which intersects the contact devices and which is arranged parallel to the wiring device and which, by way of example, is at the same distance from the wiring arrangement as from a carrier plate on which the component has been mounted or is mounted.

The grid pitch relates to the distance between the contact devices, reference preferably being made to midpoints of the contact devices, that is to say e.g. to a sphere midpoint or to a center axis, e.g. cylinder axis. In particular, in the case of a matrix, the grid pitch is equal to the distance between adjacent series, that is to say rows or columns.

The abovementioned dimensions relate e.g. to the width, that is to say the smallest lateral dimension. In the case of a square component, the abovementioned dimension is calculated in particular from the DNP (Distance from Neutral Point) by division by the value 1.41 and multiplication by the value 2. This results from the fact that the DNP is greatest in a diagonal direction.

As an alternative, the ball matrix of the component may have a dimension of greater than 7 millimeters in the case of contact devices having a diameter within the range of 270 micrometers to 330 micrometers (greatest DNP greater than 5 mm), the grid pitch between the contact devices preferably being greater than 400 micrometers.

Furthermore as an alternative, the ball matrix of the component may have a dimension of greater than 5 millimeters in the case of contact devices having a diameter of 220 micrometers to 280 micrometers (greatest DNP greater than 3.5 mm), the grid pitch between the contact devices preferably being greater than 300 micrometers.

Furthermore as an alternative, the ball matrix of the component may have a dimension of greater than 4 millimeters in the case of contact devices having a diameter of 180 micrometers to 220 micrometers (greatest DNP greater than 2.8 mm), the grid pitch between the contact devices being greater than 250 micrometers.

The use of these dimensions is possible, for example, by provision of the intermediate region and a very thin wiring arrangement, in particular a wiring arrangement produced using thin film technology. As an alternative, however, it is also possible to use a prefabricated wiring arrangement which, for example, is applied by soldering or adhesive bonding using a conductive adhesive.

In particular, the abovementioned limits may also be shifted toward greater values by up to 10 percent. In particular, contact devices are furthermore arranged as far as the edge of the component. If this is not the case, that is to say there is an edge strip without contact devices, then the abovementioned dimensions relate to the width minus the edge strip on each side, that is to say e.g. the width reduced by twice the width of the edge strip.

A housing arrangement composite is also specified, wherein the housing arrangement is electrically conductively connected to a carrier plate, in particular a carrier printed circuit board or a board. The coefficient of thermal linear expansion, or the coefficient of expansion for short, of the housing body preferably lies within the range of +50 percent to −50 percent or of +30 percent to −30 percent of the coefficient of thermal expansion of the carrier plate.

The coefficient of thermal expansion is a measure of the change in length of a material depending on the temperature. Here and hereinafter the specifications of the coefficient of thermal expansion relate to a typical operating range of e.g. −40° C. to +120° C. or 15° C. to 100° C. The coefficient of thermal expansion may be regarded as approximately constant within said range.

By complying with the abovementioned ranges of the coefficient of thermal expansion, it is possible to ensure good material matching which creates degrees of freedom for further optimizations, e.g.:

with regard to a filler which is contained in the filling material and the proportion of which determines the coefficient of thermal expansion of the filling material, or with regard to the position and extent (width) of the intermediate zone, or with regard to the dimensions of the component or of the region provided with contact devices.

However, in one development, the coefficient of thermal expansion of the filling material is e.g. greater than +5 percent or less than −5 percent relative to the coefficient of thermal expansion of the carrier plate, thus resulting in degrees of freedom for the material selection in this case, too. However, materials having an identical coefficient of thermal expansion are also used for carrier plate and filling material.

In particular, the circuit may contain a substrate whose coefficient of thermal expansion is less than the coefficient of thermal expansion of the housing body. Thus, the coefficient of thermal expansion of the circuit or of a circuit substrate lies e.g. within the range of 0.5 ppm/° C. (parts per million/degrees Celsius) to 5 ppm/° C., and in particular is approximately 2.5 ppm/° C. The coefficient of thermal expansion of the housing body is e.g. greater than the coefficient of thermal expansion of the circuit substrate, e.g. greater than 5 ppm/° C.

The coefficient of thermal expansion of the housing body advantageously lies within the range of 20 ppm/° C. to 40 ppm/° C. or within the narrower range of 25 ppm/° C. to 35 ppm/° C. The housing body thus has a comparatively high proportion of a filler. By way of example, plastic, e.g. an organic polymer, is used as the housing body. The filler is e.g. inorganic material, such as $SiO_2$. The coefficient of thermal linear expansion of the housing body is thus e.g. greater than the coefficient of thermal linear expansion of a carrier printed circuit board or of a board to which the component or the housing arrangement is electrically conductively connected via the contact devices.

The difference between the coefficient of thermal expansion of the circuit and the coefficient of thermal expansion of the carrier plate, on the one hand, and the difference between the coefficient of thermal expansion of the housing body and the coefficient of thermal expansion of the carrier plate, on the other hand, may be equal in terms of magnitude or deviate from one another by less than 20 percent or by less than 10 percent, e.g. relative to the difference that is greater in magnitude. This results in optimum conditions for the arrangement of the contact devices, in particular with an intermediate region but also without an intermediate region. By way of example, the carrier plate has a coefficient of thermal expansion of 17 ppm/° C.

As an alternative, the coefficient of thermal expansion of the filling material may lie within the range of 6 ppm/° C. to 12 ppm/° C. or within the range of 8 ppm/° C. to 10 ppm/1C. The value of the coefficient of thermal expansion of the housing body is thus e.g. less than the coefficient of thermal expansion of the carrier plate, but preferably greater than the coefficient of thermal expansion of the circuit substrate. This embodiment is used in particular in the case of housing arrangements with an intermediate region, but also in the case of housing arrangements without an intermediate region. The mechanical reliability of the contact devices during the temperature cycling can be increased by this measure. This is confirmed by simulations and test circuits produced.

The housing arrangement advantageously has at least one lateral dimension of less than 30 millimeters or less than 20 millimeters. By way of example, the housing arrangement has a square base area, e.g. with a width of less than one of the abovementioned dimensions. However, housing arrangements having a rectangular base area are also used, the length of the rectangle being e.g. less than one of the abovementioned dimensions.

In particular, the wiring arrangement is free of a so-called interposer printed circuit board material, in particular free of a laminated or pressed material or else ceramic material. Frequently used interposer materials contain plastic or glass fibers, e.g. FR4 or FR5. By way of example, no BT material is used either (bismaleimide triazine). Such interposers have e.g. a thickness of greater than 150 micrometers even with only two metallization layers. Instead of the interposer, it is possible to use a wiring arrangement produced using thin film technology, in particular more than 50 percent by volume or more than 90 percent by volume being produced using thin film technology in order that the forces arising on account of the different coefficients of thermal expansion can pass from the housing arrangement to the printed circuit board and compensate for one another in order to increase the reliability. In refinements, the wiring arrangement produced using thin film technology has a thickness of less than 50 micrometers or even less than 10 micrometers. The latter value is applicable in particular when there is only one metallization in the wiring arrangement.

The wiring arrangement may contain a polymer as insulating material, e.g. PI (polyimide), BCB (bisbenzocyclobutene) or PBO (polybenzoxazole), etc. In particular, materials which can be applied in a simple manner e.g. by spin-on are used. However, materials having properties similar to the abovementioned materials are also used.

By way of example, the housing body bears on the circuit or on an intermediate layer which, for its part, bears on the circuit, or on an intermediate layer stack which, for its part, bears on the circuit. The intermediate layer or the intermediate layer stack contains e.g. a material having good thermal conductivity. As a result of the housing body bearing thereon, the forces arising on account of the different coefficients of thermal expansion can be better compensated for.

Moreover, a method for designing a housing arrangement is specified, having the following step:
    determination of a filling material, which forms the housing body, for a housing arrangement of an integrated circuit depending on simulated reliability tests for at least two filling materials or depending on reliability tests for at least two filling materials that are carried out with housing arrangements that have been produced,
    the reliability tests relating to the reliability of contact devices which lie between the housing arrangement and an arrangement at which the housing arrangement is arranged.

The method serves in particular for preparing the production of a housing arrangement explained above, so that the technical effects mentioned there also apply to the method.

The method serves in particular for choosing the filler content of the housing body. As an alternative or in addition, however, other parameters are also chosen, e.g. the basic material of the housing body or processing conditions of the housing body which influence the coefficient of thermal expansion thereof, e.g. processing temperature or processing pressure.

In particular, the following steps are performed:
    production of at least two or at least three housing arrangements with mutually different housing body materials, in particular with materials that differ in terms of the filler content,
    carrying out temperature cycling tests for the housing arrangements.

The production of special materials for housing bodies is expensive, so that usually only the production of three to five mixtures is economically tenable. It is thus necessary, by way of example, to predefine a distribution of the grain sizes of the filler of the filling material. Precisely these grain size distributions of the filler then have to be produced in special methods. The outlay is nevertheless justified if a proportion of a filler is found which considerably increases the reliability of the assembled housing arrangements.

The temperature cycling tests are carried out e.g. within the range of −40° C. to 120° C. e.g. at least 500 or at least 1000 times, in particular by cyclically changing the temperature between two temperature values. Usually, however, fewer than 5000 temperature changing cycles are carried out, by way of example. The later conditions of use, in particular in the case of power components, are modeled well by such tests, so that reliable statements can be made about the reliability.

In particular, depending on the test result of a single series of experiments, a material is defined for the housing body, that is to say without carrying out further tests for defining the filling material, in particular the filler content of the filling material. Thus, use is made of a material of the housing body as in the test or use is made of a different material resulting from an estimation of a maximum for the reliability. However, the different material then has similar properties to the tested materials.

As an alternative, depending on the test result, it is possible to produce at least one further housing arrangement with a housing body whose material is different from the tested materials. Further temperature cycling tests are then carried out for the further housing arrangement. By way of example, it is clarified whether the curve profile for the first test series has a maximum between two measurement points or rises only moderately there, that is to say that no maximum is present there. The second test series is then included in the choice of the material that is used later for the mass production of the housing bodies.

In particular, during the tests and also during mass production, it is possible for a multiplicity of housing arrangements to be housed simultaneously in one work operation, e.g. more than 50 or 100, with the result that an economic method arises. By way of example, a screen printing method, a compression molding method or some other suitable method is used. After the introduction of material for the housing body, the diameter of a disk containing the housing arrangements is e.g. equal to the diameter of a semiconductor wafer, e.g. 200 millimeters or 300 millimeters, so that semiconductor wafers and said disks can be processed cost-effectively by means of the same machines and installations.

A molding compound that is already liquid or pasty before it starts to be introduced into a device, e.g. a compression mold, is advantageously used for the housing body. The filler substance proportion in the molding compound can thus be established simply and cost-effectively, in particular in comparison with a molding compound present in tablet form prior to pressing. The pressure at the end of the compression molding is e.g. greater than 20 bar and is e.g. less than 100 bar. The compression molding is e.g. possible without and with bonding wires which are arranged at the circuit and around which the molding compound then flows.

As an alternative, a material that is solid when introduced into the device is used for the housing body, e.g. granules or a tablet. There a large number of materials in these forms, thereby facilitating the selection of a material having a specific coefficient of thermal linear expansion.

In particular, the wiring arrangement may be produced only after the introduction of the housing body using thin film technology at the partly completed housing arrangement. In comparison with use of a printed circuit board in the housing arrangement, on account of the different coefficients of expansion, the forces are passed on by the wiring arrangement produced using thin film technology directly to the carrier printed circuit board, with the result that, equalization of forces can occur. The housing body, in particular its material, has, after all, been selected precisely with regard to said equalization of forces.

Apart from the minimum dimensions to be produced, the methods for integration and the thin film technology use identical methods, e.g. layer depositions, lithography, etching, etc. The minimum dimensions in the case of thin film technology are greater than 100 micrometers, by way of example, while the minimum dimensions in the case of integrated circuits, particularly in lower layers, are less than 1 micrometer.

By way of example, the housing arrangement may be arranged on a carrier plate, e.g. soldered onto a printed circuit board or adhesively bonded using conductive adhesive. The coefficient of thermal expansion of the carrier plate is taken into account during the reliability tests in order to be able to detect the mechanical reliability of the contact devices.

A method for designing a housing arrangement or a component is also specified in which the position and in particular the extent, that is to say e.g. the width and length, of an intermediate region that is free of contact devices is determined for a housing arrangement. This is carried out depending on reliability tests relating to the reliability of contact devices lying between the housing arrangement and a carrier arrangement on which the housing arrangement is arranged. The carrier arrangement is a carrier printed circuit board, by way of example.

This aspect is based on the consideration that the position of the intermediate region can be determined in a simple manner in particular on the basis of simulations or on the basis of temperature cycling test series on fabricated housing arrangements. Thus, in consultation with purchasers of the housing arrangements, it is possible to influence predefinitions which predefine the arrangement of the contact devices and thus of the intermediate region, in order to increase the reliability of the contact devices in this way.

In particular, the position of the boundary of the intermediate region toward the zone with the outer contact devices is determined. However, the position of the boundary of the intermediate region toward the inner contact devices is also determined as an alternative or in addition.

The design process involves determining the contact device positions for reliable housing arrangements, in particular for housing arrangements having large fan-out areas, the housing arrangements being produced in particular at the wafer level as embedded packages.

The reliability tests advantageously take account of the thermal linear expansion of the material of the housing body, which can be arranged in the housing arrangement in a plane with a circuit of the housing arrangement. Consequently, the technical effects mentioned above also apply to this aspect.

The components or housing arrangements explained can be mounted with or without underfilling. In some embodiments, the chip with the integrated circuit is extended by a circumferential frame or ring, which forms the housing body and may be formed e.g. from epoxy material, e.g. with the aid of a compression molding method. Said ring serves as a so-called fan-out area and may be used for the application of a wiring device and also interconnect elements or contact devices, e.g. solder balls. For wafer level packages on silicon wafers, for example, there is a maximum distance from a chip midpoint (midpoint) at which a package or housing arrangement applied to the board or the carrier printed circuit board, e.g. by soldering or by means of conductive adhesive, still satisfies the temperature cycling reliability requirements.

Therefore, no solder balls can be arranged outside this radius around the midpoint. This applies, in principle, to compression-molded wafers, too.

What can be achieved by suitable choice of the material of the housing body, in particular its filler, is that even packages or housing arrangements with interconnect elements at a large distance from the midpoint (DNP) achieve a high reliability. In this case, the coefficient of thermal linear expansion (CTE) of the filling material should be chosen such that it has a value in the vicinity of the value of the coefficient of expansion of the board or else a larger value. As a result, the stress or the loading, in particular the so-called equivalent plastic creep strain, in the respective solder ball of the ball matrix increases from the midpoint of the chip toward its edge. The last solder ball on the chip is exposed to the highest loading, by way of example.

If the coefficient of thermal expansion of the material of the housing body, e.g. molding compound, is chosen to be greater than the coefficient of thermal expansion of the board or the carrier plate, e.g. after the transition to the molding compound or the filling material mixture the board now has the lower coefficient of expansion than the package. As a result, the stress in the contact elements now decreases first to zero again with increasing distance from the midpoint, only then in order to rise again (opposite sign). As a result, even inflexible interconnect elements such as e.g. solder balls are still reliable at a large distance from the chip midpoint, which cannot be achieved for standard wafer level packages, that is to say for packages in which an embodiment of the invention is not realized.

This explanation is based for example on a simple model which matches the simulation results. However, the simulation results can, if appropriate, also be clarified assuming other models which, in particular, also hold true if the coefficient of thermal expansion of the filling material is less than the coefficient of thermal expansion of the board. By way of example, it should be taken into consideration that stress is also taken up at a contact device on account of the rigid connection of board and housing arrangement, so that the assumption of a linear increase in the stress is a considerable simplification. Consequently, this theory is not restrictive for the general technical teaching.

The choice of a coefficient of thermal expansion of the molding compound can thus be adapted to the chip or housing arrangement size requirements, with the result that even relatively large package sizes can be realized in a reliable manner. In other cases, owing to a low degree of warpage, a coefficient of thermal expansion of the module compound or molding compound may also be chosen to be equal to, less than or insignificantly less than the coefficient of thermal expansion of the board.

It holds true for the packages that solder balls can be arranged from the center of the chip, e.g. center of mass, as far as a first maximum distance from the midpoint (DNP), the value of the maximum distance depending e.g. on:
 the solder ball size,
 the coefficient of thermal expansion of the board,
 the coefficient of thermal expansion of the chip,
 the solder ball material, or
 the required TC loading (temperature cycling).

From the first maximum distance from the midpoint as far as a further distance from the midpoint, at which the stress on the molding compound has fallen below a critical magnitude again, no solder balls are accommodated, by way of example.

By way of example, the following approximately holds true in the range of ball heights of 0.2 mm to 0.3 mm for the maximum permissible distance from the midpoint on silicon $$DNP_{max} \approx 160*(\text{ball height})*(\text{ball height}) - 58*(\text{ball height}) + 8$$

Outside this range, no input/output terminals are arranged owing to low solder ball reliability on the silicon or other semiconductor material. Where the next solder ball series is accommodated is then not until on the fan-out area again. The distance between the chip edge and the first solder ball on the fan-out area is determined e.g. by:
 the coefficient of thermal expansion (CTE) of the molding compound,
 the number of "depopulated ball rows" or the number of solder ball series left free or not applied,
 solder ball size,
 the coefficient of thermal expansion of the board,
 the coefficient of thermal expansion of the chip,
 the solder ball material, or
 the desired TC loading.

Moreover, there is a second maximum distance from the midpoint, starting from which solder bails can no longer be accommodated reliably on the molding compound, in particular with regard to the thermomechanical stress. This third distance is determined e.g. by:
 the chip size,
 the solder ball size,
 the coefficient of thermal expansion of the board,
 the coefficient of thermal expansion of the chip,
 the coefficient of thermal expansion of the molding compound, or
 the required TC loading.

It is thus possible to produce reliable packages with solder balls or other contact devices which are at a large distance from the midpoint. Production is preferably effected at the wafer level, which guarantees a high temporal and spatial parallelism and hence low costs. A small package height results on account of embedding in the housing body or the molding compound. In addition, by virtue of the adaptation of the coefficients of thermal expansion CTE, it is not necessary e.g. to use high solder balls, having a height of e.g. greater than 500 micrometers, for supporting thermomechanical reliability.

Consequently, a universal package wafer molding concept is specified which makes use of a housing body, e.g. a molding compound, whose coefficient of thermal expansion is e.g. in the vicinity of the coefficient of thermal expansion of the PCB (Printed Circuit Board), e.g. within the range of +30 percent to −30 percent of the coefficient of thermal expansion of the board, or else more than that. With the interconnect elements only being arranged starting from a specific distance from the midpoint on the molded fan-out area, it is possible to produce a highly reliable and very large WLP (Wafer Level Package).

As the size of the housing arrangements increases, however, numerous problems occur, e.g. if dimensions of greater than 7 millimeters are to be chosen in the case of solder balls having a diameter of 300 micrometers and a grid pitch of 500 micrometers. In particular, it is necessary to eliminate restrictions of the package size or housing arrangement size for so-called wafer level packages, that is to say for packages in which housing arrangements provided with housing bodies firstly form a disk having the dimensions of a wafer. By way of example, use could be made of flexible contact devices which compensate for the mismatches occurring during temperature cycling between the housing arrangement and the carrier printed circuit board, in particular the shear forces. However, the loading capacity of these packages would be very low, with the result that additional measures for stabilization would be necessary. However, these measures would be complicated, expensive and counterproductive with regard to increasing the reliability. Other solutions might focus on underfilling the interspace between the wiring arrangement and the carrier printed circuit board in order to achieve a fixed coupling to the carrier printed circuit board and thus to generate bending forces instead of the shear forces. This process would likewise be expensive and does not function e.g. when the carrier printed circuit board is populated on both sides. Furthermore, the underfilling might have a disadvantageous effect on other reliability tests, e.g. with regard to storage in a humid atmosphere.

Some embodiments of the invention are explained below with reference to figures which serve only for illustration and are not intended to restrict the scope of the invention.

FIG. 1 shows a sectional view of a BGA housing arrangement 10 soldered onto a printed circuit board 25. In a plane pointing into the surface of the page, the housing arrangement 10 contains a chip or a semiconductor chip 12 and also a molding compound 14, which forms a housing body 14, the extent of which is considerably greater in the horizontal direction than in the vertical direction, e.g. more than 10 times as great. In the exemplary embodiment, the semiconductor chip 12 is a silicon chip. With regard to the dimensions of the chip 12 and contact devices, reference is made again to the alternatives mentioned in the introduction.

A wiring arrangement 16 containing one or more interconnect layers, by way of example, extends parallel to said chip plane. In the exemplary embodiment, an area facing upward, that is to say the area 15 pointing toward the semiconductor chip 12 and toward the molding compound 14, of the wiring arrangement bears directly on the semiconductor chip 12 and on the molding compound 14. A contact area 17 of the wiring arrangement 16 points downward or to the printed circuit board 25. The wiring arrangement 16 has, in particular, the thickness mentioned in the introduction, which is 10 micrometers in the exemplary embodiment.

A multiplicity of contact devices, e.g. solder balls or differently shaped soldering connections, are arranged at the contact area 17. FIG. 1 illustrates two inner solder balls 18 and 20 and also two outer solder balls 22 and 24. By contrast, an intermediate region 31 of the contact area 17 contains no contact devices, that is to say that the contact devices or solder balls have been omitted here. Consequently, the distance between the two adjacent solder balls 20 and 22 is more than 1.5 times as great as the distances between the other adjacent solder balls 22 and 24, and respectively 20 and 18.

An optional edge region 34, in which likewise no contact devices are arranged, adjoins the region for the outer contact devices 22, 24.

In the exemplary embodiment, the elements of a housing composite comprising housing arrangement 10 and printed circuit board 25 have the following coefficients of thermal expansion:

2.5 ppm/° C. for semiconductor chip 12,
31 ppm/° C. for the molding compound 14,
17 ppm/° C. for the printed circuit board 25.

On account of these coefficients of thermal expansion, the stress relationships shown in a system of coordinates KS1 could form assuming a model with a linear profile of the stress with increasing distance from a midpoint. The system of coordinates KS1 specifies on its x axis 26 the position with respect to a midpoint P0, at which the equivalent plastic creep strain has the value zero. A y axis 28 of the system of coordinates KS1 shows the equivalent plastic creep strain in the solder material.

A value W of the equivalent plastic creep strain is the value which must not be exceeded in the composite comprising housing arrangement 10 and printed circuit board 25. In the example, the equivalent plastic creep strain rises from the midpoint P0 of the chip 12 to the edge of the chip 12 at a position P2, see section 30 of the curve profile. An at least local maximum of the creep strain would be able to be found in a solder ball at the chip edge P2. On account of the higher coefficient of thermal expansion of the molding compound 14 surrounding the chip 12, the stress or the creep strain then falls to zero again with increasing distance, see section 32 and position P4. The magnitude of the creep strain subsequently rises again, section 33.

The intermediate region 31 lies between positions P1 and P3 at which the creep strain has or exceeds the value W. Consequently, the position P2 having a local maximum creep strain likewise lies in the intermediate region 31.

What can be achieved through suitable choice of the materials, in particular of the filling material 14, is that the angles $\alpha 1$, $\alpha 2$ and $\alpha 3$ between the sections 30, 32 and 33 and the x axis 26 are approximately equal in magnitude, thus resulting in an optimum ratio between the width of the intermediate region 31 and the width of an outer region between the positions P3 and P5, that is to say the region for the outer solder balls 22, 24, etc. In particular, the width of the intermediate region 31 is then not excessively large and the width of the outer region for the outer solder balls 22, 24 is not excessively small.

If W is the maximum permitted creep strain in a solder ball, in order to achieve a predetermined reliability when testing the second level, positions at which the stress would exceed said value W are not used, therefore. A large and very reliable wafer level package can be produced in this way.

Figure 2:
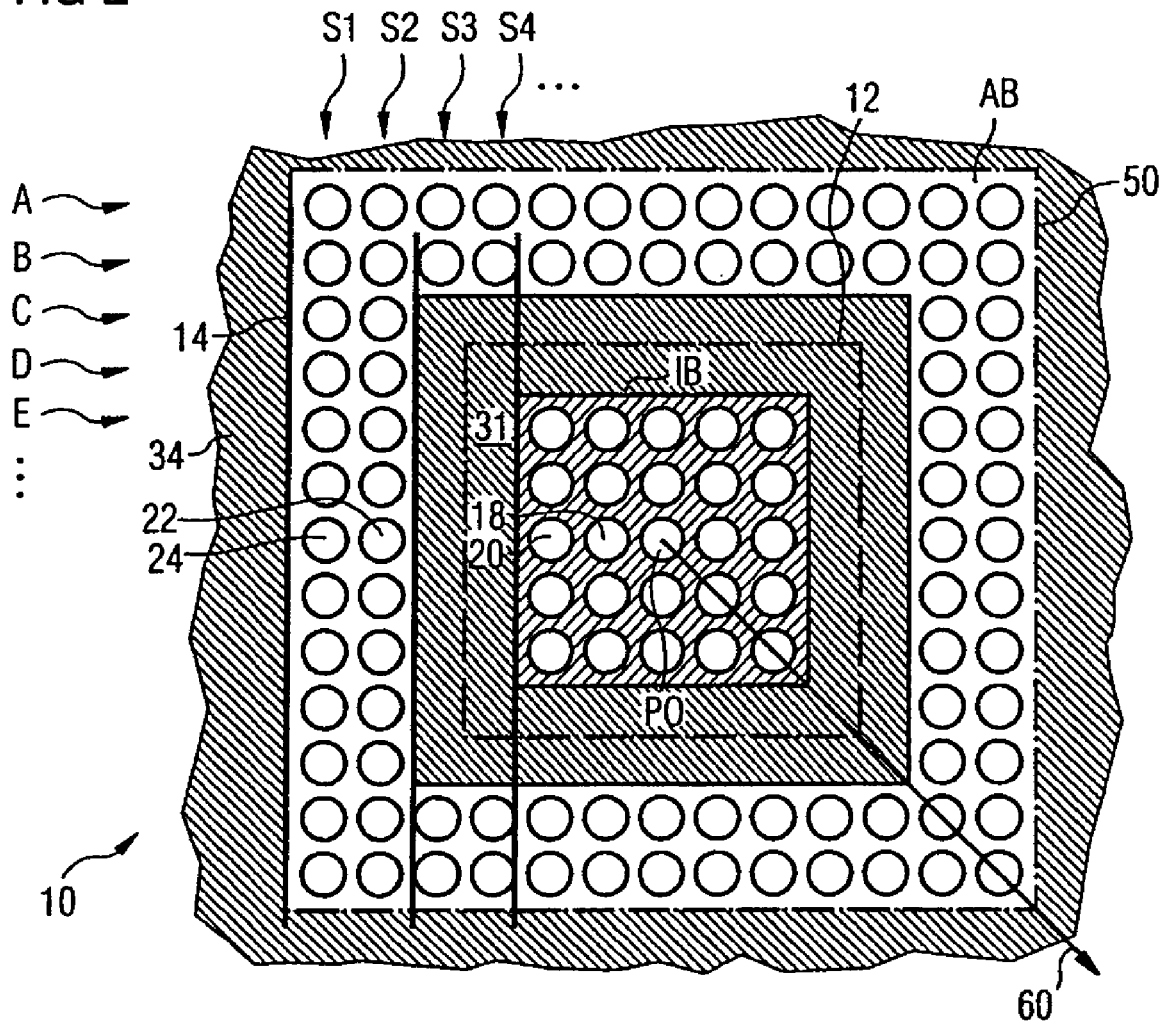
FIG. 2 shows a bottom view of one embodiment of the housing arrangement.

FIG. 2 shows a bottom view of the housing arrangement 10. The solder balls 18 to 24 and also the further solder balls illustrated are arranged in accordance with a matrix at crossover points of thirteen columns S1 to S4, etc. of the matrix and thirteen rows A to E, etc. of the matrix. In the exemplary embodiment there are, arranged in five columns times five rows, i.e. 25, inner solder balls 18, 20, etc. in an inner region IB. The inner region IB is surrounded by the intermediate region 31, in which two rows and columns of contact devices are respectively omitted at each section. The chip edge of the chip 12 lies precisely between the two omitted series. Consequently, the intermediate region 31 overlaps both the chip 12 and the housing body 14. The outer region AB with the outer solder balls 22, 24, etc. adjoins the intermediate region 31. The outer region AB contains two series each lying along the contour of a square. This is followed by the optional region 34. Without a region 34, the housing arrangement ends e.g. at a contour 50.

An arrow 60 points outward from the midpoint P0 and illustrates that relevant distance from midpoint P0 which has also been mentioned several times in the introduction.

In other exemplary embodiments, the housing arrangement 10 contains a matrix having more or fewer than 13 columns and/or rows. The arrangement of the intermediate region 31 is also different in other exemplary embodiments. Thus, more than two series of contact devices are omitted or only one series of contact devices is omitted. Instead of the square arrangement of the contact devices shown, it is also possible to choose other arrangements, for example rectangular or hexagonal. However, complying with a high symmetry in the arrangement of the contact devices increases the reliability, but is not absolutely necessary.

Figure 3A:
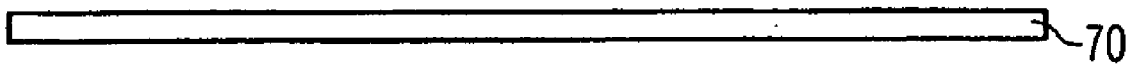
FIGS. 3A to 3F show production stages during one embodiment of a method for the simultaneous production of a multiplicity of housing arrangements.

FIGS. 3A to 3E show production stages during the simultaneous production of a multiplicity of housing arrangements, in particular including the housing arrangement 10. As is illustrated in FIG. 3A, a carrier plate 70 is used which has a contour that would project beyond a semiconductor wafer on all sides. The carrier plate 70 comprises e.g. a metal, silicon, a polymer or some other suitable material.

Figure 3B:
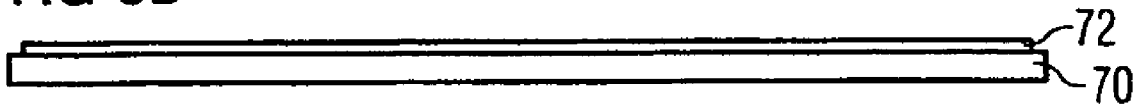

As is shown in FIG. 3B, e.g. a double-sided adhesive film 72 is laminated or adhesively bonded onto the carrier plate 70. The film 72 can easily be stripped away, e.g. by being pulled off, if appropriate using a solvent. As an alternative, by way of example, only a layer of adhesive is applied.

Figure 3C:
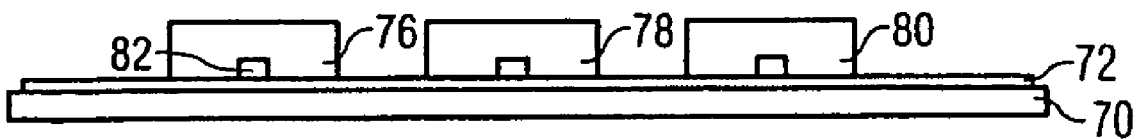

As is shown in FIG. 3C, a multiplicity of semiconductor chips 76 to 80 and also 12 (not illustrated) are then adhesively bonded onto the adhesive film 72, e.g. automatically in a so-called pick-and-place method. The semiconductor chips 76 to 80 and also 12 contain integrated circuits that have already been pretested or are untested and each have a multiplicity of active components, see e.g. component 82 in semiconductor chips 76. In the exemplary embodiment, the direction of the normal to the area with the active components of the semiconductor chips 76 to 80 points to the film 72, at least one integrated metallization layer being arranged between the active area and the film 72. As an alternative, however, the non-active sides of the semiconductor chips 76 to 80 and also 12 point to the film 72, e.g. if the semiconductor chips 76 to 80 have plated-through holes from the active side to their rear side or similar connection possibilities.

Figure 3D:

As is illustrated in FIG. 3D, a molding compound 90 that is still liquid or pasty is then poured onto the semiconductor chips 76 to 80, compression-molded and cured, the molding compound preferably being heated, in addition, with the result that it forms a housing body. This method is referred to as compression molding. This process makes use of a mold which makes it possible to produce a disk having the diameter and the thickness of a wafer. If the molding compound covers the rear side of the semiconductor chips 76 to 80, it affords an additional protection. However, the molding compound 90 may also end at the level of the rear side of the semiconductor chips 76 to 80 and also 12 or below said level in other exemplary embodiments. The steps for selection of the molding compound 90 are explained in more detail below with reference to FIG. 5.

Figure 3E:

As is shown in FIG. 3E, the carrier plate 70 is removed after the molding compound 90 has been cured. The film 72 is removed subsequently or at the same time, e.g. using UV light (ultraviolet). An optional protective layer is also removed or a cleaning step is effected for cleaning the uncovered area of the molding compound disk produced.

Figure 3F:
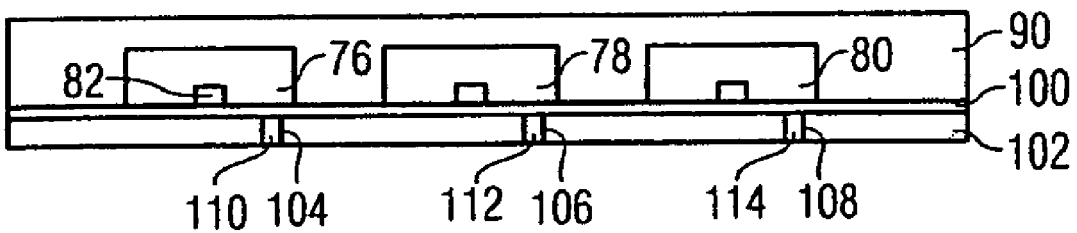

As is shown in FIG. 3F, a seed layer or growth seeding layer 100, e.g. made of copper, is then applied using thin film technology, by way of example. Afterward, a photoresist 102 is applied and patterned in a lithography method, see e.g. openings 104 to 108. This is followed e.g. by carrying out electroplating with external current in order to produce copper interconnects 110 to 114, inter alia. The photoresist 102 is removed and the growth seeding layer 100 is removed in the uncovered regions. An electrically insulating layer is then applied, e.g. by being spun on.

The insulating layer is patterned by means of a lithography method in order to open the contact regions. Solder, for example, is then applied in order to produce the contact devices or solder balls, in particular the solder balls 18 to 24 of the housing arrangement 10. The housing arrangements are furthermore separated from one another and tested. Later the housing arrangements are soldered onto printed circuit boards.

FIG. 4 shows a table 120 containing simulation results for the reliability of contact devices of a further housing arrangement having a molding compound having a coefficient of thermal expansion of 31 ppm/° C. (parts per million/degrees Celsius). Columns S1 to S18 and rows A to U are illustrated, at the points of intersection between which the simulation result for the relevant position is respectively specified.

A line of symmetry 122 runs through positions lying on a diagonal. On account of the symmetry, only the positions shown above the line of symmetry 122 have been calculated. For the positions lying below the line of symmetry 122, the values are mirror-inverted with respect to the line of symmetry 122. The line of symmetry runs from the top left corner 124 to the midpoint of the matrix of solder balls. The molding compound and the lateral area of the circuit meet one another at a boundary 126 in the arrangement on which the simulation is based.

A finite element simulation confirms the fundamental considerations for the embodiments of the invention. As can be seen, the precalculated durability in the solder balls decreases from the chip center, see table 120, bottom right corner, along the line of symmetry 122 to the separating edge or boundary 126. After crossing the molding compound fan-out zone, the durability rises again as far as a specific distance from the midpoint. The durability of the soldering connections or solder balls then decreases again.

If a critical value W for the durability is 3500, by way of example, then no contact devices or solder balls should be arranged at an intermediate region 130 and at an edge region 128. The position of said regions 128, 130 would change if a molding compound having a different coefficient of thermal expansion were included in the simulation.

Figure 5:
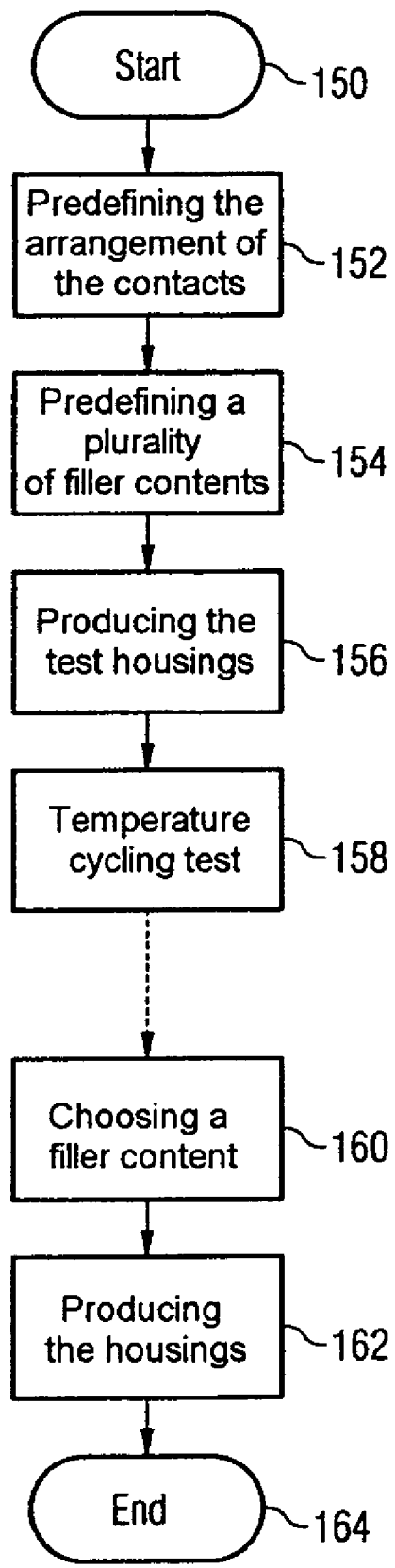
FIG. 5 shows one embodiment of method steps for defining the filler proportion of an encapsulating material for one embodiment of the housing arrangement.

FIG. 5 shows method steps for defining the filler proportion of a filling material or of a molding compound for the housing body of a housing arrangement, for example in preparation for the production of the housing arrangement 10. The method starts in a method step 150. In a method step 152, which temporally succeeds the method step 150, the arrangement of the solder balls 18 to 24, etc. is predefined, e.g. by a manufacturer or a purchaser of the housing arrangement 10. If appropriate, this involves already utilizing the results of previous simulations, e.g. the results from the table 120.

A method step 154 involves predefining the parameters for a plurality of molding compounds, e.g. for three molding compounds having e.g. a coefficient of thermal expansion that is less than, a coefficient of expansion that is equal to, and, respectively, a coefficient of thermal expansion that is greater than, a coefficient of thermal expansion of the printed circuit board 25, which is 17 ppm/° C. in the example. Consequently, the three molding compounds might have e.g. a coefficient of thermal expansion of 8 ppm/° C., 17 ppm/° C. and 31 ppm/° C. However, other values are also possible, e.g. three or more than three values which are greater or alternatively less than the coefficient of thermal expansion of the printed circuit board 25. Tests could also be carried out with different printed circuit board materials, which would then have different coefficients of thermal linear expansion.

From the predefined parameters for the coefficient of thermal expansion of the molding compound, e.g. filler proportions and distributions for the grain size of the filler are then predefined with the aid of relationships known from plastics production. This should already involve close collaboration with the manufacturer of the molding compounds.

In a method step 156, with the three molding compounds supplied by the molding compound manufacturer, e.g. three or typically more than three test housing arrangements are then produced, in particular by compression molding around integrated circuits. By way of example, the production method explained with reference to FIGS. 3A to 3F is used in this case. The housing arrangements are then soldered onto printed circuit boards.

After the test housing arrangements have been produced and soldered on, temperature cycling tests are carried out in a method step 158, e.g. in accordance with the temperatures mentioned in the introduction and the number of cycles mentioned. During the test cycles or between test cycles, by way of example, functional tests of the housing composite arrangements are carried out, in particular with regard to the electrical conductivity of the connection at the contact devices or solder balls, that is to say the electrically conductive connection between housing arrangement and printed circuit board. Defective connections are noted for evaluation, e.g. together with the number of the cycle in which the failure occurred.

In a method step 160, the test is evaluated after the conclusion of the temperature cycling test. At the end of the evaluation, e.g. the molding compound which led to housing composite arrangements having the longest lifetime is selected. In this case, e.g. statistical assessments are also included if more than one housing arrangement was produced per molding compound.

Optionally, however, after the first test series, parameters for a further test series are predefined in order to optimize the housing composite arrangements further with regard to their lifetime.

If the molding compound to be used is then fixed, in a method step 162 the housing arrangement 10 is produced using said molding compound, in particular in mass production, that is to say e.g. with more than 1000 items produced. The method is then ended in a method step 164.

In other exemplary embodiments, as an alternative or in addition, other parameters which determine the coefficient of expansion are also taken into account and varied, e.g.:
the basic material of the molding compound,
temperature for curing the molding compound,
pressure during compression molding,
the proportion of additives in addition to the basic substance and filler in the molding compound, e.g. curing agents or plasticizers.

The invention claimed is:

1. A component, comprising:
an integrated circuit that includes one or more contacts;
a housing body encapsulating the integrated circuit;
a wiring arrangement disposed below and fixed to the integrated circuit and the housing body that includes an insulating layer, wherein a thickness of the wiring arrangement is less than 50 micrometers
a plurality of contact devices disposed below the wiring arrangement for providing electrical contact between the wiring arrangement and a carrier plate, wherein the wiring arrangement is adapted to produce an electrical connection between the one or more contacts of the integrated circuit and the plurality of contact devices; and
a first and second group of contact devices of the plurality of contact devices that define an intermediate zone that overlaps an edge of the integrated circuit and that does not contain contact devices and wherein a minimum distance between the first and second group of contact devices is greater than a distance between mutually adjacent contact devices of the first and second group of contact devices, respectively;
wherein the integrated circuit and housing body are positioned in a first plane and the wiring arrangement extends in a second plane that is parallel to the first plane,
wherein the component is electrically conductively connected to the carrier plate, the coefficient of thermal expansion of the housing body being within a range of +50 percent to −50 percent of the coefficient of thermal expansion of a carrier plate, and
wherein the coefficient of thermal expansion of the housing body is greater than the coefficient of thermal expansion of the carrier plate by at most 50 percent.

2. The component of claim 1, wherein the first group of contact devices is arranged in series.

3. The component of claim 1, wherein:
the first group of contact devices is positioned closer to an edge of the component than the second group of contact devices;
the first group of contact devices are arranged in accordance with a matrix in a multiplicity of columns and a multiplicity of rows;
the intermediate zone located between the first group of contact devices and the second group of contact devices, free of contact devices; and
no contact devices are arranged at crossover points between a row and a column of the matrix.

4. The component of claim 3, wherein the intermediate zone overlaps the housing body.

5. The component of claim 1, wherein a coefficient of thermal expansion of the housing body is less than a coefficient of thermal expansion of the carrier plate.

6. The component of claim 1, wherein a coefficient of thermal expansion of the housing body is within a range of 6 ppm/° C. to 12 ppm/° C.

7. A method for producing a component, comprising:
arranging a multiplicity of mutually separate circuits on an auxiliary carrier;
applying a housing body material into interspaces between one or more of the multiplicity of mutually separate circuits after arranging the multiplicity of mutually separate circuit on the auxiliary carrier, wherein the housing body material encapsulates one or more of the multiplicity of mutually separate circuits;
fixing a wiring arrangement below the mutually separate circuits and the housing body material, the wiring arrangement including an insulating layer,
fixing a plurality of contact devices for providing electrical contact between the wiring arrangement and a carrier plate, wherein the wiring arrangement is adapted to produce an electrical connection between the one or more contacts of the mutually separate circuits and the plurality of contact devices; and
producing a first and second group of contact devices of the plurality of contact devices for each of the separate circuits, each of the first and second groups of contact devices defining an intermediate zone that overlaps an edge of the respective separate circuit,
wherein the intermediate zone does not contain contact devices and wherein a minimum distance between respective first and second groups of contact devices is greater than a distance between mutually adjacent contact devices; and
wherein the multiplicity of mutually separate circuits and the housing body material are arranged in a first plane and the wiring arrangement extends in a second plane that is parallel to the first plane.

8. The method of claim 7, wherein the wiring arrangement is produced using thin film technology after the introduction of the housing body.

9. The component of claim 1, wherein the component comprises a dimension of greater than 9 millimeters, the one or more external contact devices comprising a diameter of 450 micrometers to 550 micrometers, and grid pitch is located between the one or more external contact devices comprising a range of 750 micrometers to 850 micrometers.

10. The component of claim 1, wherein the component comprises a dimension of greater than 7 millimeters, the one or more external contact devices comprising a diameter of 270 micrometers to 330 micrometers, and grid pitch is located between the one or more external contact devices that is greater than 400 micrometers.

11. The component of claim 1, wherein the component comprises a dimension of greater than 5 millimeters, the one or more external contact devices comprising a diameter of 220 micrometers to 280 micrometers, and grid pitch is located between the one or more external contact devices that is greater than 300 micrometers.

12. The component of claim 1, wherein the component comprises a dimension of greater than 4 millimeters, the one or more external contact devices comprising a diameter of 180 micrometers to 220 micrometers, and grid pitch is located between the one or more external contact devices that is greater than 250 micrometers.

13. A component, comprising:
an integrated circuit that includes one or more contacts;
a housing body encapsulating the integrated circuit;
a wiring arrangement disposed below and fixed to the integrated circuit and the housing body that includes an insulating layer, wherein a thickness of the wiring arrangement is less than 50 micrometers
a plurality of contact devices disposed below the wiring arrangement for providing electrical contact between the wiring arrangement and a carrier plate, wherein the wiring arrangement is adapted to produce an electrical connection between the one or more contacts of the integrated circuit and the plurality of contact devices; and
a first and second group of contact devices of the plurality of contact devices that define an intermediate zone that overlaps an edge of the integrated circuit and that does not contain contact devices and wherein a minimum distance between the first and second group of contact devices is greater than a distance between mutually adjacent contact devices of the first and second group of contact devices, respectively;
wherein the integrated circuit and housing body are positioned in a first plane and the wiring arrangement extends in a second plane that is parallel to the first plane,
wherein a coefficient of thermal expansion of the housing body is within a range of 15 ppm/° C. to 40 ppm/° C.

14. A component, comprising:
an integrated circuit that includes one or more contacts;
a housing body encapsulating the integrated circuit;
a wiring arrangement disposed below and fixed to the integrated circuit and the housing body that includes an insulating layer, wherein a thickness of the wiring arrangement is less than 50 micrometers
a plurality of contact devices disposed below the wiring arrangement for providing electrical contact between the wiring arrangement and a carrier plate, wherein the wiring arrangement is adapted to produce an electrical connection between the one or more contacts of the integrated circuit and the plurality of contact devices; and
a first and second group of contact devices of the plurality of contact devices that define an intermediate zone that overlaps an edge of the integrated circuit and that does not contain contact devices and wherein a minimum distance between the first and second group of contact devices is greater than a distance between mutually adjacent contact devices of the first and second group of contact devices, respectively;
wherein the integrated circuit and housing body are positioned in a first plane and the wiring arrangement extends in a second plane that is parallel to the first plane,
wherein the component is arranged on a carrier plate, and a difference between a coefficient of thermal expansion of the integrated circuit and a coefficient of thermal expansion of the carrier plate and a difference between a coefficient of thermal expansion of the housing body and a coefficient of thermal expansion of the carrier plate are equal.

* * * * *